United States Patent
Benzel et al.

(10) Patent No.: US 7,569,412 B2
(45) Date of Patent: Aug. 4, 2009

(54) METHOD FOR MANUFACTURING A DIAPHRAGM SENSOR

(75) Inventors: Hubert Benzel, Pliezhausen (DE); Frank Schaefer, Tuebingen (DE); Simon Armbruster, Reutlingen (DE); Gerhard Lammel, Tuebingen (DE); Christoph Schelling, Reutlingen (DE); Joerg Brasas, Walddorfhaeslach (DE)

(73) Assignee: Robert Bosch GmbH, Stuttgart (DE)

( * ) Notice: Subject to any disclaimer, the term of this patent is extended or adjusted under 35 U.S.C. 154(b) by 181 days.

(21) Appl. No.: 11/011,898

(22) Filed: Dec. 13, 2004

(65) Prior Publication Data

US 2005/0142687 A1    Jun. 30, 2005

(30) Foreign Application Priority Data

Dec. 16, 2003  (DE)  .................. 103 58 859
Jul. 24, 2004  (DE)  .................. 10 2004 036 035

(51) Int. Cl.
*H01L 21/00* (2006.01)
(52) U.S. Cl. ................. 438/53; 257/419; 257/E21.215; 216/99
(58) Field of Classification Search ............. 438/52, 438/53, 753; 257/414, 419, E21.215; 216/99
See application file for complete search history.

(56) References Cited

U.S. PATENT DOCUMENTS

| | | | | |
|---|---|---|---|---|
| 4,532,700 A | * | 8/1985 | Kinney et al. ............... 438/409 |
| 5,242,863 A | * | 9/1993 | Xiang-Zheng et al. ........ 438/53 |
| 5,445,991 A | * | 8/1995 | Lee .............................. 216/2 |
| 2002/0151100 A1 | * | 10/2002 | Coffa et al. ................... 438/50 |
| 2002/0170875 A1 | | 11/2002 | Benzel et al. |
| 2003/0116813 A1 | * | 6/2003 | Benzel et al. ............... 257/414 |
| 2003/0127699 A1 | * | 7/2003 | Artmann et al. ............. 257/419 |

FOREIGN PATENT DOCUMENTS

| | | |
|---|---|---|
| DE | 100 30 352 | 1/2002 |
| DE | 100 32 579 | 1/2002 |
| DE | 101 38 759 | 3/2003 |
| EP | 1306348 | 5/2003 |

OTHER PUBLICATIONS

"Low-pressure vapor-phase epitaxy of silicon on porous silicon," *Material Letters* 94 (1988), by L. Vescan et al.

* cited by examiner

*Primary Examiner*—Steven J Fulk
(74) *Attorney, Agent, or Firm*—Kenyon & Kenyon LLP

(57) ABSTRACT

A method for producing a micromechanical diaphragm sensor includes providing a semiconductor substrate having a first region, a diaphragm, and a cavity that is located at least partially below the diaphragm. Above at least one part of the first region, a second region is generated in or on the surface of the semiconductor substrate, with at least one part of the second region being provided as crosspieces. The diaphragm is formed by a deposited sealing layer, and includes at least a part of the crosspieces.

20 Claims, 15 Drawing Sheets 500
510

500   510

500   510

510   500

Fig. 13a
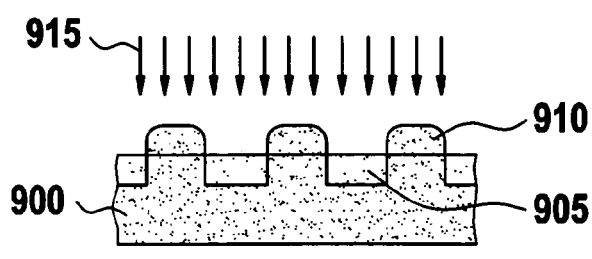
Fig. 13b
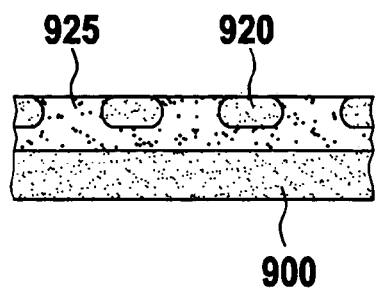
Fig. 13c
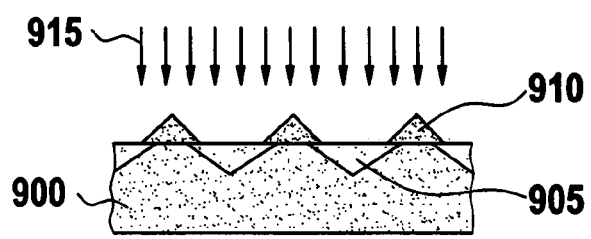
Fig. 13d
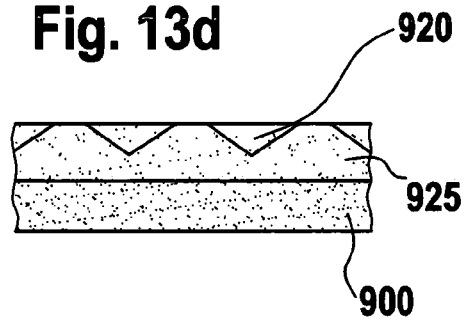
Fig. 13e
Fig. 13f
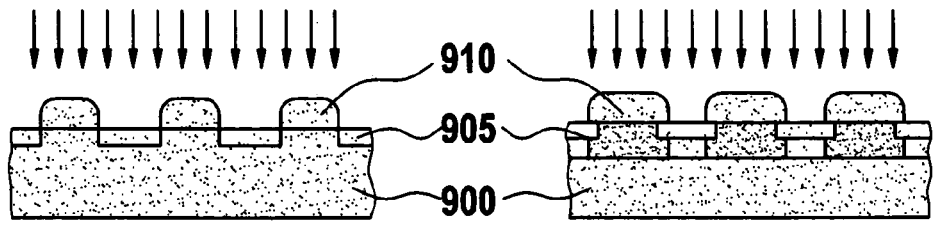
Fig. 13g

METHOD FOR MANUFACTURING A DIAPHRAGM SENSOR

FIELD OF THE INVENTION

The present invention relates to a method for manufacturing a semiconductor component.

BACKGROUND INFORMATION

Semiconductor elements, and diaphragm sensors in particular, are known already, as well as methods for producing diaphragm sensors on the base of semiconductor substrates such as silicon wafers. Flat porous diaphragm regions are arranged on the semiconductor substrate as substrate layer for sensor structures, for instance, and a cavity is produced underneath the diaphragm for, e.g., the thermal insulation of the diaphragm.

The diaphragm sensors currently on the market are mostly fashioned as thin film diaphragm sensors. For this purpose, layer systems in thicknesses between a few 10 nm and a few μm are deposited on a carrier substrate and after that, the carrier substrate is removed in predefined areas, so as to obtain self-supporting areas. The structural elements of the sensor can then be arranged in the center of the diaphragm. Surface micromechanics (SMM), in which a sacrificial layer is generally used that is deposited on the front side of a carrier substrate before diaphragm deposition, constitute another possibility for exposing the diaphragm. The sacrificial layer is later removed from the component side of the sensor through "detachment openings" in the diaphragm, whereby a self-supporting structure is created. These surface micromechanical methods are comparatively costly, on account of the necessity for separate sacrificial layers.

Published German patent document DE 100 32 579 discloses a method for manufacturing a semiconductor element and also a semiconductor element produced according to the method, in which, e.g., for a diaphragm sensor, a layer of semiconductor substrate material that was rendered porous is situated above a cavity. Two layers having different porosity are formed to produce the cavity using appropriate etching parameters. Whereas the first layer has lower porosity and seals up during a subsequent first annealing step, the porosity of the second layer increases during the annealing step in such a way that a cavity or a cavern is formed. In a second process step, at a higher annealing temperature, a relatively thick epitaxial layer as second diaphragm layer is grown on top of the first diaphragm layer formed from the first porous layer.

It may also be provided that a thin epitaxial layer be grown during the first annealing step so as to ensure complete sealing of the porous first layer, which is used as starting layer for the epitaxy growth of the thick epitaxial layer. In this context, a lower growth rate is preferred at a lower temperature compared to the subsequent deposition of the thick epitaxial layer.

As a result of the measures mentioned, the construction of an SMM semiconductor element can be simplified considerably since no additionally deposited sacrificial layer is required and, furthermore, the diaphragm itself or an essential portion of the diaphragm is produced from semiconductor substrate material.

However, tests have shown that at least partially porous diaphragm may get damaged already during production, or that damage may not always be reliably prevented under normal operating conditions. To avoid damage to the diaphragm during manufacture or in regularly occurring application cases, published German patent document DE 101 38 759 provides a method for manufacturing a semiconductor element having a semiconductor substrate, in which the semiconductor substrate in the region of the porous diaphragm layer receives a doping that differs from the doping in the region of the later cavity. After doping, the semiconductor material of the diaphragm layer is rendered porous, and the semiconductor material underneath the semiconductor material that has been rendered porous is at least partially removed or rearranged to provide a cavity.

Published German patent document DE 100 30 352 discloses a micromechanical component which has a support body made of silicon and a regionally self-supporting diaphragm which is joined to the support body. The diaphragm is regionally and superficially provided with at least one stabilizing element for support. To form the regionally self-supporting diaphragm, it is provided that the silicon is rendered porous in a first region and is selectively removed via an etching opening once the diaphragm layer has been deposited.

SUMMARY OF THE INVENTION

The present invention provides a method for producing a semiconductor component, especially a micromechanical diaphragm sensor, as well as a semiconductor component having a semiconductor, a diaphragm and a cavity. In this context it is provided that the semiconductor substrate has a first region having a first doping. It is also provided that the diaphragm is situated in the semiconductor substrate above the cavity. Various process steps are provided for producing the diaphragm. In a first process step, on the surface of the semiconductor substrate, above at least one part of the first region, a second region is generated having a second doping, it being especially provided that the second doping occupies different planes, that are distinguishable locally on the surface of the semiconductor substrate, which, however, are connected to one another, and consequently form a linked second region. It is advantageous if at least one part of the second region is developed as crosspieces. In a second process step, the first region is at least partially dissolved out by an appropriate process control, e.g., by anodizing or by electropolishing. For the final production of the diaphragm, in a third process step, a closing layer is applied in such a way that the material of this layer grows onto the crosspieces. Now, an important aspect of the present invention is that the closing layer forming the diaphragm grows in a lateral and/or vertical direction, starting from the growth on at least one part of the crosspieces, and thus covers the first region. It may also be provided that the cavity is generated from at least one part of the first region, the cavity being able to be generated before or after the third step. Besides the monocrystalline epitaxial layer, the diaphragm has at least one part of the crosspieces.

Advantageously, the cavity in the first region is generated by a prebake method or a trench process.

In a further example embodiment of the present invention, the crosspieces or a grating formed from the crosspieces is generated above the first region or at least partially in the first region. Advantageously, it is additionally provided that the crosspieces should be generated in such a way that they are at least partially adjacent to the first region. Advantageously, at least one part of the second region is provided as a framing of the first region. In this context, the framing refers to the surface of the semiconductor substrate or to the vertical extension of the first region into the depth of the semiconductor substrate, starting from the surface.

In one example embodiment of the present invention, the first region and the crosspieces have different vertical extensions starting from the surface into the depth of the semiconductor substrate. In this context, it is especially provided that the first region has a greater vertical extension compared to the crosspieces. Thereby, the crosspieces, with the exception of the surface, are able to be enclosed on all sides by the first region. In another embodiment of the present invention, it may be provided that the crosspieces have a lesser vertical extension than the framing. The vertical and/or the lateral extension of the crosspieces may vary too, in this context. In one embodiment of the present invention, it is provided that the crosspieces run right up to the edge, i.e., up to the framing, the crosspieces and the framing being n doped.

The elimination of the semiconductor material from the first region is achieved in one example embodiment of the present invention by a micromechanical process. In this context, by a suitable control of this micromechanical process, a rendering porous of the first region may be achieved, a nearly uniform porosity of the first region being able to be brought about. Furthermore, in the case of a suitable selection of parameters which control the micromechanical process, a porosity of up to 100 percent may be achieved in the first region. In this context, a porosity of 100 percent corresponds to a cavern formation or a cavity formation. Micromechanical processes having such an effect are, for example, electropolishing or an anodizing process.

In another example embodiment, before the depositing of the closing layer onto the crosspieces, the porous semiconductor material and the cavity walls are oxidized chemically or thermally, for example. This gives the advantage that the epitaxy material is deposited on the crosspieces, and not on the porous first region or the cavity walls. Thus, it may be prevented that the cavity grows through the material of the closing layer. The embodiment may also be used to lock in the oxide underneath a diaphragm.

The cavity below the diaphragm made of the closing layer and the crosspieces may be produced using different methods. Thus, there is a possibility of annealing the semiconductor substrate, after the depositing of the closing layer, which represents a closed diaphragm layer, and thus to induce the porous semiconductor material in the first region to rearrange itself. In response to a suitable selection of the annealing temperature, on account of surface effects, the diameters of the pores in the first layer increase, since the semiconductor material collects at the edges of the first region. In a further example embodiment of the present invention, the porous semiconductor material is at least partially selectively eliminated by an etching process. In this context, it is provided that the selective elimination of the porous semiconductor material is achieved through at least one access hole, which may be formed either before generating the first region or after producing the closed closing layer in the semiconductor substrate.

In one further example embodiment of the present invention, the closing layer is applied to the component side of the semiconductor substrate. For the purpose of eliminating semiconductor material of the first region, the access hole may optionally be generated in the semiconductor substrate from the back or the component side. If the access hole is closed pressure-tight after elimination of the semiconductor material, one should take care that the pressure prevailing during the closing defines the reference pressure in the cavity. Advantageously, the access hole is put in the first region from the backside of the semiconductor substrate, and, after elimination of the semiconductor material, it is left open. Thereby, in a simple manner compared to those of the prior art, one may generate a backside sensor or a differential pressure sensor having an exactly defined diaphragm thickness.

In one additional example embodiment of the present invention, the porous part of the first region and/or the cavity is passivated before depositing the closing layer. By this passivation, advantageously, a depositing of the material of the closing layer onto the semiconductor material and/or onto the cavity wall is prevented.

In one example embodiment of the present invention, in a further process step, the diaphragm is structured in order to produce resonator structures. With the aid of such resonator structures, using the present invention acceleration sensors or yaw rate sensors may be generated, for example. However, it is also conceivable to mount resistor structures on the diaphragm which are able to record the motion of the diaphragm with the aid of the piezoelectric effect.

In one further example embodiment of the present invention, the surface of the semiconductor substrate or the first region is irradiated using a radiation source. The regions thus irradiated subsequently generate the second region which, in one embodiment of the present invention, has the same doping as the first region. By the radiation it is advantageously prevented that the semiconductor material, of the regions thus irradiated, is eliminated during the second step. The elimination of the semiconductor material may, in this context, be brought about, for instance, by porous etching or electropolishing. As radiation sources, light sources such as a laser are available. If a laser having a matchable wavelength is used, the possibility exists of selecting different penetration depths of the irradiation or illumination, and thus to vary the formation of the second region or the vertical extension of the crosspieces, particularly during production. Methods for patterning the illuminated region on the surface of the semiconductor substrate include shadow masks, diffraction patterns or (holographic) grids.

Besides the example embodiments of the present invention described so far, the first and the second region may optionally have different doping. For example, the semiconductor substrate or the future cavity region in the semiconductor substrate may have a p doping, and the crosspieces may have an n doping. Furthermore, within the second region, a difference in the doping concentration may be provided for the crosspieces and for the framing. Advantageously, the semiconductor substrate has silicon or a silicon compound as the semiconductor material. The first region of the semiconductor material in the semiconductor substrate is rendered porous in such a way that a uniform, high porosity is created. In one embodiment of the present invention, it is provided that the first region under the crosspieces is at least partially rendered porous, and for the first region under the crosspieces a vertical extension is provided that is twice as high as the lateral extension of the crosspieces. In a further embodiment of the present invention, it is provided that the crosspieces are positioned in a lattice above the first region or above the cavity, between the crosspieces on the surface access to the first region being possible. The holes that are created by the interspace between the crosspieces are, in this context, provided in an example embodiment of the present invention to be smaller than 3 μm. In general, the closing layer may be deposited by an epitaxial method. Moreover, between the first and the second region, a non-conductive boundary layer may be generated. After the thermal oxidation and before the epitaxy, the oxidized, porous semiconductor material may be etched out.

BRIEF DESCRIPTION OF THE DRAWINGS

FIGS. 13a-13g show various example embodiments of a method for producing a lattice having a desired cross-section profile.

DETAILED DESCRIPTION

Figure 1A:
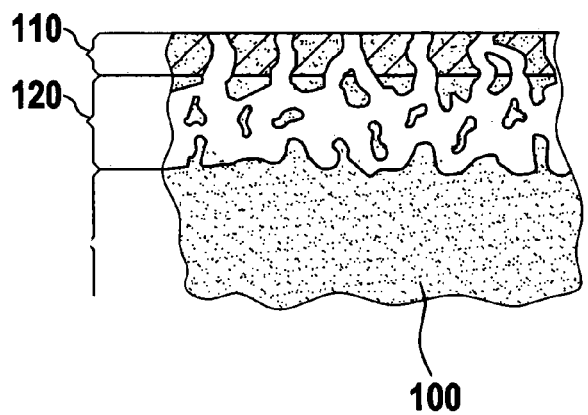
FIGS. 1a-1d show various stages of a known method for manufacturing a micromechanical diaphragm.
Figure 1B:
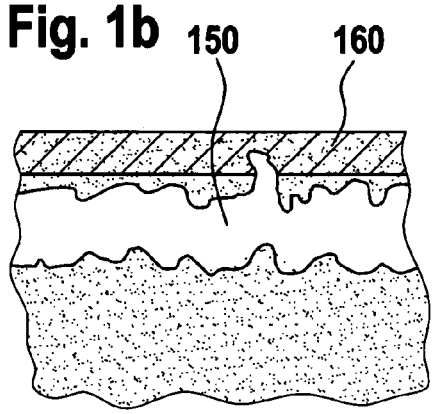
Figure 1C:
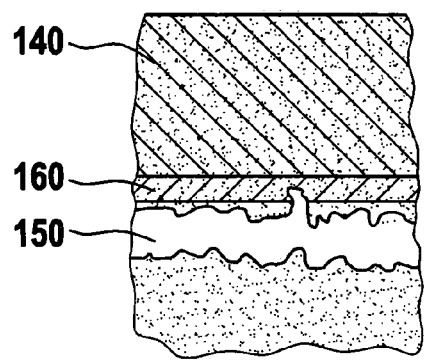

As shown in FIG. 1a, a conventional method for producing a diaphragm provides using a porous double layer in a semiconductor substrate 100, i.e., a low-porosity layer 110 and a high-porosity layer 120 situated underneath it, it is possible to produce a starting layer 160 that is suitable for the growth of epitaxial layer 140, as well as a cavity 150 (cf. FIG. 1b). The transformation is accomplished by a first annealing step (at approximately 900 to 1000° C.), during which the semiconductor atoms of low-porosity layer 110 rearrange in such a way that the surface seals. In the same or in a following annealing step, cavity 150 is then able to be formed as well by rearrangement of the semiconductor atoms out of high-porosity layer 120. This is accomplished in that the pores enlarge under the influence of the annealing step and finally unite to form a "giant pore," which then constitutes the cavity. To produce the diaphragm, an epitaxial layer 140 may then be deposited on starting layer 160, which determine the characteristics of the diaphragm. However, there will be some pores that have not sealed in the production of such a diaphragm since the available silicon is insufficient. In some areas several small pores also unite to form a large pore so that pores having diameters of up to 0.5 μm are created. The epitaxial layer, which forms the later diaphragm, is unable to grow on these unsealed areas in the starting layer in a monocrystalline manner, since the crystal structure of the base is faulty. As a result, crystal faults form in the epitaxial layer (for instance, due to stacking faults). In the further course of the process, piezoresistive resistors, for instance, which are required for the functioning of a pressure sensor, are produced on the upper surface of the diaphragm. Crystal faults in the epitaxial layer may degrade these resistors over the service life of the sensor and result in drift of the sensor signal.

When producing a monocrystalline epitaxial layer, the deposition of a first thin epitaxial layer (thinner than 1 μm, preferably 200 to 600 nm) may remedy this situation, in which additional semiconductor material is offered for the complete sealing of the starting layer immediately at the outset, during or at the end of the first annealing process. It may be the same semiconductor material which is already present in layer 110 and/or in epitaxial layer 140 that is deposited. If semiconductor substrate 100 is made, for example, of silicon, such a method gives the offered silicon atoms sufficient time to arrange themselves according to the silicon crystal of the base. A lower temperature and a reduced growth speed are advantageously selected during the growing of the thin epitaxial layer compared to the subsequent, thick epitaxial layer. As an example, the temperature during the deposition of the thin epitaxial layer is approximately 900 to 1000° C., whereas the growth speed is selected to be less than 0.5 μm/min.

After the growth of this thin epitaxial layer and a possible continuation of the annealing process, the substrate is exposed to a higher temperature (preferably 1100 to 1200° C.) so that a second, thick epitaxial layer 140 may then be grown there (a few μm). Prior to the growing of the second epitaxial layer, further annealing at the higher temperature may also be carried out in order to heal any possible crystal faults in the sealed starting layer. Because of its relatively great thickness—compared to the starting layer and the first epitaxial layer—the second epitaxial layer forms the actual diaphragm. This diaphragm may then be used for a pressure sensor, for instance, or, following further patterning, for an acceleration sensor as well.

Figure 1D:
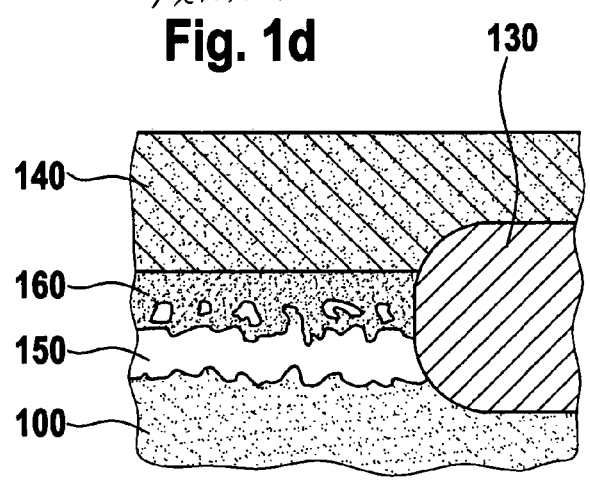

Depositing a single-crystalline, micromechanical diaphragm on a porous starting layer has various weak points, which may have a negative effect on the production or the service life of the diaphragm. For example, cracks may form in the porous starting layer, which spread to the epitaxial layer deposited thereon. Furthermore, transitions from, for instance, $p^+$ doped starting layer 160 to a framing of the starting layer may occur. In an overlap of both dopings, the $p^+$ doping is reduced to a p doping (see 130, FIG. 1d). However, a lower p doping also causes higher porosity. This effect is also utilized in the production of the double layer according to FIG. 1a where low-porosity layer 110 has a $p^+$ doping, for instance, and high-porosity layer 120 has a lower p doping. Consequently, the low-porosity layer is connected to the edge via a high-porosity, and therefore fragile, region. Among others, cracks may form here during the production.

Figure 2A:
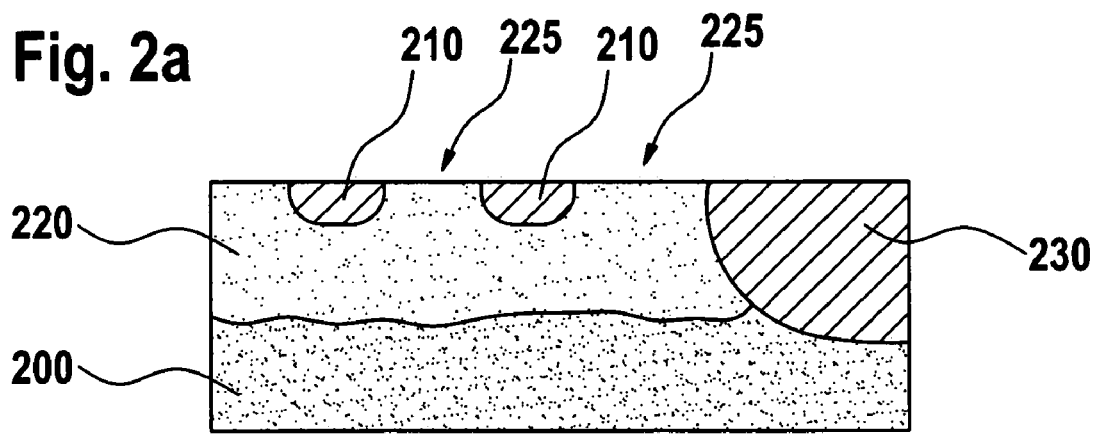
FIGS. 2a-2b show the various stages of an exemplary embodiment of the method of the present invention.

To produce a monocrystalline diaphragm according to the present invention, as shown in FIG. 2a, a first region 220 and a first portion of a second region 210 having different dopings are generated on a semiconductor substrate 200, according to the present method, first region 220 being also able to be composed of the substrate doping. In the following exemplary embodiment, it is to be assumed that semiconductor substrate 200 has a p doping, first region 220 a p or $p^+$ doping, and first and second portions 210 and 230 of the second region have an n or $n^+$ doping. In this context, in a special exemplary embodiment, the first portion of the second region that is denoted by reference numeral 210 in FIG. 2a, is formed on the surface of the semiconductor substrate as a type of crosspiece or lattice, whereas the second portion of the second region, that is denoted by reference numeral 230 in FIG. 2a, is formed as framing of first region 220. In another example embodiment of the present invention, it may be provided that portion 230 and portion 210 of the first region have different dopings, such as $n^+$ or n.

Figure 2B:
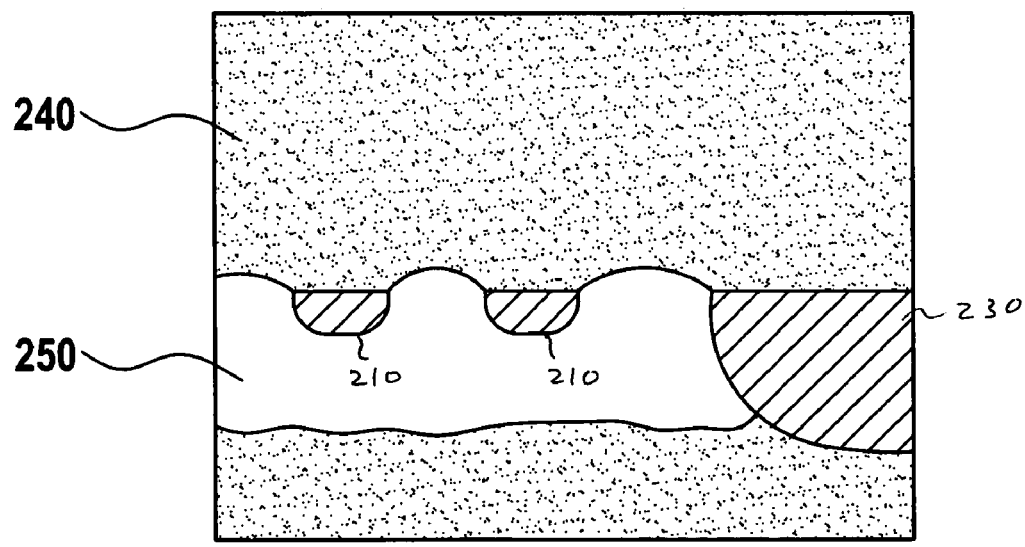

Using a suitable etching process, for instance anodizing or electropolishing, first region 220 is etched to be rendered porous. In this context, as already described, first region 220 may be both a portion of untreated semiconductor substrate 200 and an additionally doped region. The latter has the advantage of allowing a sharper delimitation in the production of porous region 220. Whereas first region 220 is etched porous up to a depth of 5 to 20 μm, for instance, starting from the surface of semiconductor substrate 200, second region 210 is essentially not changed by the etching process. In an appropriate selection of the lateral extension of second region 210 on the surface of semiconductor substrate 200, first region 220 may be etched to be rendered porous underneath second region 210 as well. For further processing, an exemplary embodiment provides that first region 220 have high porosity. Pore sizes may be of 1 nm up to several μm in diameter. As an alternative, high porosity may be achieved by producing very many small pores (~5 nm) or a few very large pores (e.g., up to several 100 nm). As in the production of large pores, the result is such that a lot of silicon is etched out. If semiconductor substrate 200 is made of silicon, a (natural) oxide layer can be found on the surface of the untreated semiconductor substrate. For this reason, a reduction of the (natural) oxide layer on the silicon surface is obtained in a following process step in that a short annealing of the semiconductor substrate or the silicon substrate is carried out in a hydrogen atmosphere. As an alternative, an "HF load" method or an HF GPE (gas phase etching) method with subsequent low-temperature epitaxy may be used to achieve the same effect. Afterwards, the semiconductor substrate is heated to growth temperature (1000 to 1200° C.) before the deposition of a monocrystalline epitaxial layer 240 is initiated. The epitaxial layer grows predominantly on second regions 210 and 230. In an exemplary embodiment, regions 210 are formed as monocrystalline crosspieces to promote the growth of the epitaxial material. The growth not only occurs vertically, i.e., perpendicular to the surface, but laterally as well, so that the regions between individual crosspieces 210 are sealed by a monocrystalline layer. FIG. 2b shows the diaphragm after epitaxial layer 240 has been grown. During the growth process and under the influence of the growth temperature or during an additional annealing operation, the highly porous silicon has been rearranged to form a large cavity 250. The form resulting from the growth of the free regions between the crosspieces can be seen on the underside of the diaphragm in FIG. 2b. Further annealing allows this form to fuse in a planar manner.

The highly porous silicon between monocrystalline crosspieces 210 is advantageous here since it prevents the growth of silicon inside the cavity region. If the cavity were completely free, depending on the growth conditions, silicon could grow on the cavity walls from the beginning of the epitaxial growth onwards. However, due to the initially porous surface between crosspieces 210, which rearranges itself over the course of the epitaxy process, it is prevented that silicon grows between crosspieces 210 or that a significant input of the epitaxy material into cavity 250 takes place.

Of course, the generation of an epitaxial layer having a cavity situated underneath it by means of being rendered porous, as it is described in the present invention, may also be implemented when other materials or semiconductor materials are used, and is not restricted to the use of silicon. However, this requires that these other materials or semiconductor materials are also able to be rendered porous.

In another exemplary embodiment of the present invention, the region between and underneath the crosspieces is not etched porous, but is completely eliminated. This may be accomplished by electropolishing, for instance, and the porosity is increased by varying the etching parameters (such as increasing the current, reducing the HF concentration), to such a degree that it achieves 100 percent. As described earlier, the crosspieces are now able to grow together (closed), which entails the danger that within the cavity silicon also grows on. To avoid this, the inside of the cavity may be protected by a layer that prevents silicon from growing on there.

Figure 3A:
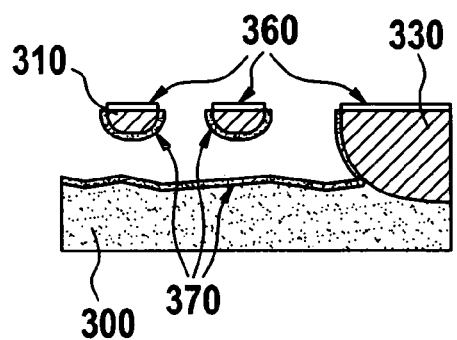
FIGS. 3a-3b illustrate the steps of a treatment of the surface to prevent the deposition of epitaxial material according to the present invention.
Figure 3B:
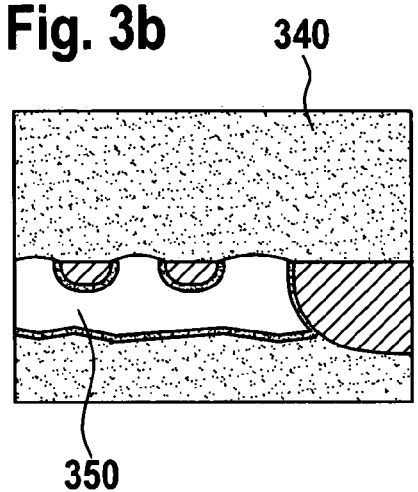

Such a protection is able to be achieved, for instance, by the application of a silicon nitride layer (such as $Si_3N_4$) 360 on the surface of second regions 310, as shown in FIG. 3a. Using electropolishing, second regions 310 which are in the form of crosspieces and are connected to one another and to framing 330, may subsequently be exposed by removal of the first region (cf. cross section through the semiconductor substrate in FIG. 3a). An oxide 370 is generated on the exposed regions of future cavity 350 via thermal oxidation, for instance. Using hot phosphoric acid, for example, nitride 360 is subsequently able to be selectively dissolved away with respect to oxide 370. Such preparation allows a selective epitaxy to be achieved, i.e., the epitaxy material 340 (such as silicon) will grow only on the regions that are not protected by oxide 370. This prevents silicon growth in cavity 350.

Another possibility for selectively preventing the growth of silicon is to apply a thin (<60 nm) silicon oxide layer ($SiO_2$) to those regions that are not to be electropolished, prior to the application of silicon nitride layer (such as $Si_3N_4$) 360. After crosspieces 310 have been exposed by a suitable etching process, for instance by electropolishing, an oxide may be generated on the exposed regions by thermal oxidation, as in the already discussed example. However, it must be taken into account that this oxide has to be thicker than the oxide underneath the SiN mask. Subsequently, the nitride may be selectively dissolved with respect to the oxide. As an alternative, a dry-etching process may be carried out as well in which the oxide and the nitride have the same etching rates. By suitable selection of the etching time it is possible to ensure that a sufficiently thick oxide layer remains on the cavity walls once the oxide that was situated underneath the SiN has been dissolved. Finally, a selective epitaxy may then be carried out analogously to the above exemplary embodiment.

In yet another exemplary embodiment, in which the semiconductor substrate is made of silicon, for instance, the silicon is rendered porous by etching between and underneath the crosspieces. Afterwards, a thin layer of oxide, which is a few nm thick, for example, is generated on all silicon surfaces (i.e., on the wafer surface as well as on the surface of the pore walls). This may be done, for instance, by thermal oxidation, by oxygen-plasma treatment, by chemical oxidation or also some other type of treatment. This oxide prevents the rearrangement of the porous silicon during additional high-temperature steps as are required in the epitaxy or other furnace processes. The oxide on the wafer surface may now be removed by a brief HF dip using diluted hydrofluoric acid (HF), or a dry chemical oxide etching process using $ClF_3$ or $XeF_2$. Due to the surface tension, the hydrofluoric acid does not penetrate the pores, so that the oxide layer continues to remain on the pore walls. A corresponding description of such a pretreatment for stabilizing the porous silicon for a subsequent epitaxial growth can be found, for instance, in the article "Low-pressure vapor-phase epitaxy of silicon on porous silicon," *Material Letters* 94 (1988), by L. Vescan et al. An expitaxial layer may subsequently be grown, this layer growing predominantly on the monocrystalline crosspieces. The surface is sealed by lateral growth. After the epitaxy, an access hole may be etched through the epitaxial layer from the front side, for instance, or also from the back side of the semiconductor substrate, and the oxidized porous silicon be selectively dissolved out through the access hole. As an option, the access hole may also be sealed again after the removal process, it being taken into account that the pressure prevailing during sealing of the access hole defines the reference pressure in the cavity.

The diaphragm produced in this manner may be used, for instance, for a pressure sensor having piezoresistive resistors. For this purpose, a circuit may be integrated adjacent to or on top of the diaphragm. If an access hole for the selective removal of the semiconductor material in the second region was generated on the backside, a backside sensor or differential-pressure sensor is obtained, which has a precisely specified diaphragm thickness compared to the related art. If an access hole is made from the front side, this hole must be sealed again in a pressure-tight manner for the pressure-sensor application.

In another exemplary embodiment, it is provided to pattern the diaphragm in the form of resonator structures. The use of such structures makes is possible to implement acceleration sensors and/or yaw-rate sensors, for instance.

Figure 4A:
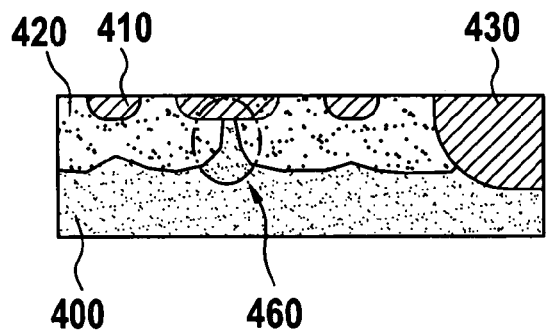
FIGS. 4a-4b show the steps of an additional exemplary embodiment for the manufacturing of a diaphragm according to the present invention.
Figure 4B:
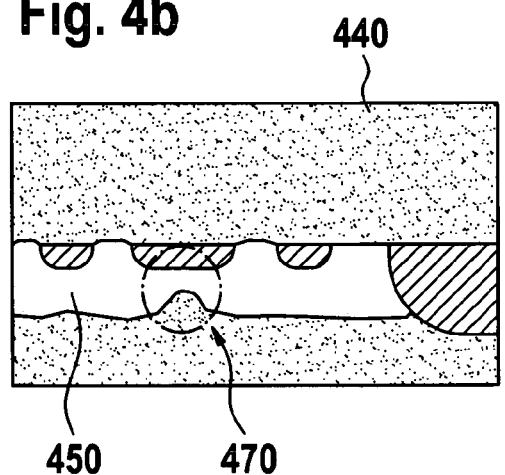

One possibility for stabilizing the crosspieces before the epitaxial layer is grown is to optionally generate supports underneath the crosspieces, which melt away during subsequent high-temperature steps (epitaxy or annealing steps (oxidation, diffusion) for the generation of integrated circuits) due to rearrangement of the silicon atoms. As can be seen from FIG. 4a, in region 460, columns are created if crosspieces 410 are wider than half of the etching-depth in first region 420. The isotropic undercut-type etching during anodization is then insufficient to anodize the silicon underneath the broadened crosspieces 410 or to dissolve it out. For reasons of energy (minimizing the surface energy) silicon rearranges itself at high temperatures (>1000° C.). In the process, the column (region 470) "melts" and the firm connection between substrate and diaphragm is broken. As a result, the diaphragm can move freely, as shown in FIG. 4b.

Instead of individual crosspieces, the second region above the cavity may also be arranged in the form of a lattice, porous regions 510 and crosspieces 500 alternating with each other. In FIGS. 5a to 5f, various possible example embodiments are shown, the mentioned examples not being intended to be considered as final, limiting illustrations. In this context, better resist adhesion is noticeable in FIGS. 5e and 5f, for example.

Figure 6A:
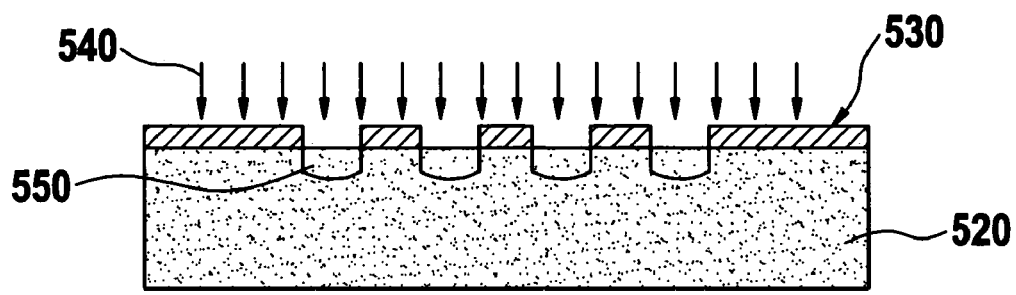
FIGS. 6a-6c show the steps of an example embodiment of a method for producing crosspieces or lattices above a cavity.
Figure 6B:
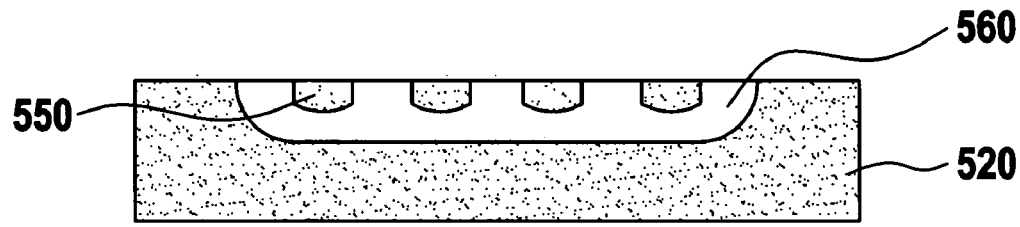
Figure 6C:
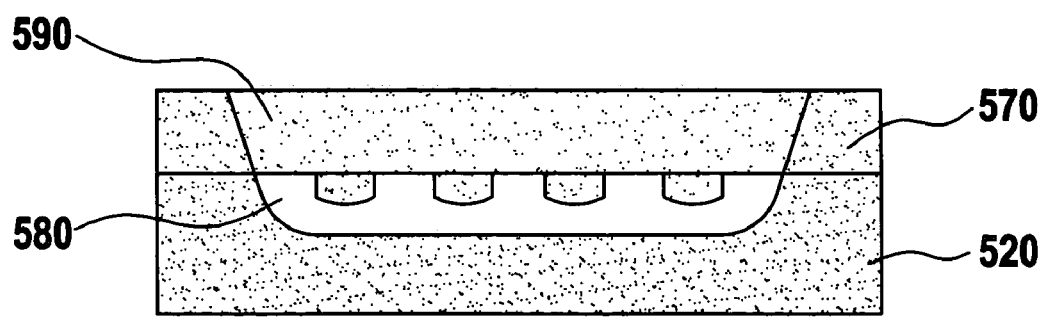

Various methods are available to implement the crosspieces or the lattice on which the monocrystalline diaphragm is deposited in a later method step. For instance, in one exemplary embodiment the crosspieces or the lattice, instead of being generated by local n doping, are generated by local amorphization of the single-crystalline Si substrate. As shown in FIG. 6a, the single-crystalline semiconductor substrate made of silicon 520 is bombarded with high-energy ions 540, such as argon ions. Due to this bombardment and the use of an implantation mask 530, for instance made of $SiO_2$, the single-crystalline structure is destroyed and regions 550 having amorphous silicon are created. The amorphous Si 550 remaining behind is not attacked in the following anodization in hydrofluoric acid, so that underneath amorphous regions 550 a region 560 of porous Si is created (FIG. 6b), which is able to rearrange itself to form a cavity in a subsequent annealing process. In this way an amorphous Si lattice 550 is produced, which may be overgrown by an epitaxy process prior to or after this subsequent annealing operation. Corresponding to the amorphous base, epitaxial layer 590 (FIG. 6c) does not become single-crystalline, but polycrystalline, in contrast to layer 570 which grows on monocrystalline region 520. The transition between polycrystalline region 590 and monocrystalline region 570 is determined by the epitaxial parameters.

In one variant of this exemplary embodiment, additional annealing may be carried out before the epitaxial layer is grown. Due to this annealing, the amorphous crosspieces are able to recrystallize and rearrange in the form of a single-crystalline lattice. This recrystallization step makes it possible to generate a monocrystalline Si epitaxy on the lattice crosspieces.

Figure 7A:
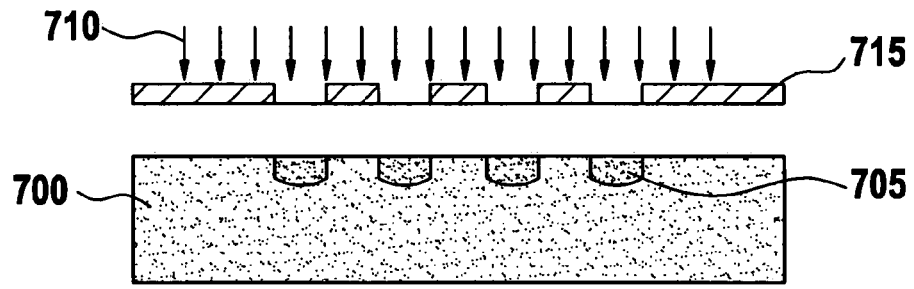
FIGS. 7a-7c show the steps of another example embodiment of a method for producing crosspieces or lattices.
Figure 7B:
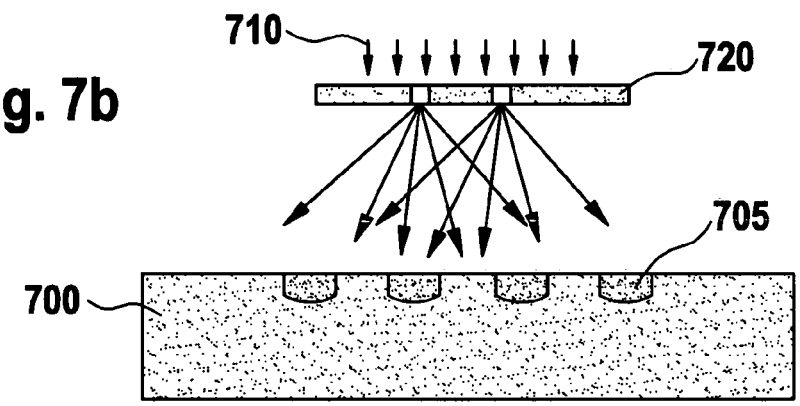
Figure 7C:
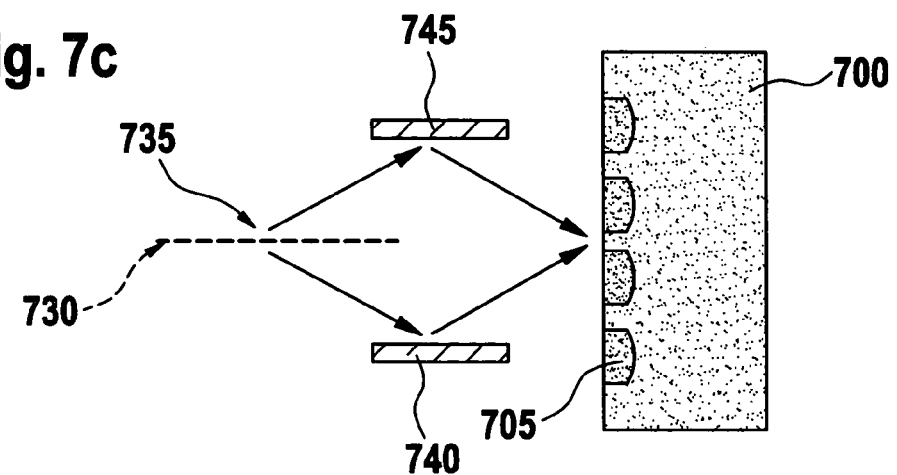

In another exemplary embodiment for producing an Si lattice on porous silicon, the illumination selectivity of the anodization process may be utilized. In this context, as illustrated in FIGS. 7a to 7c, a p doped silicon substrate 700 is illuminated (using ions 710 or laser beam 735) during anodizing, so that regions 705 are created, which counteract the anodizing process due to the charge substrates generated by the internal photo effect. With the aid of a suitable shadow mask 715, a diffraction pattern 720 or a holographic lattice (FIG. 7c), a lattice-shaped region 705 of substrate 700 to be anodized may be illuminated and thereby protected from being rendered porous. Since the penetration depth of the light is limited as a function of the wavelength, the region protected in this manner is ultimately etched in an undercut manner. The following epitaxial process or the generation of the cavity may then be carried out in a manner that is analogous to the method already described.

To produce a holographic lattice, a laser beam 735, as shown in FIG. 7c, may be guided onto a beam splitter 730, the two partial beams being reflected at mirrors 740 and 745 and interacting with one another on the substrate surface in region 705.

Figure 8A:
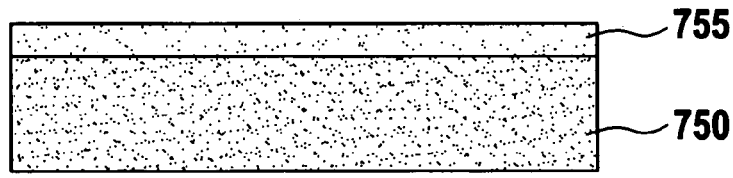
FIGS. 8a-8b show the steps of another example embodiment of a method for producing crosspieces or lattices.
Figure 8B:
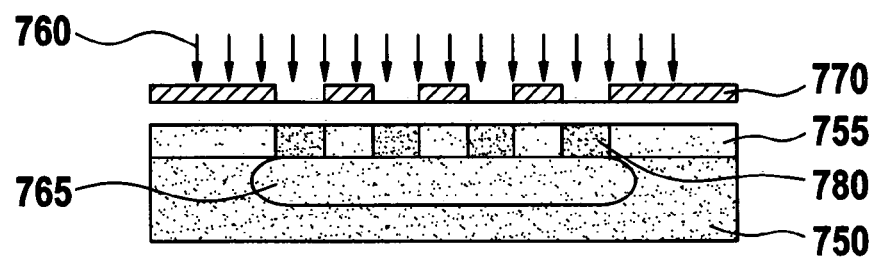

In an extension of the last exemplary embodiment, it may also be provided to first produce an n doped Si epitaxial layer 755 on a p doped Si substrate 750, as shown in FIG. 8a. According to FIG. 8b and following the previous exemplary embodiment according to FIGS. 7a to 7c, n-doped Si epitaxial layer 755 is illuminated using suitable illumination 760 and a shadow mask 770 (of metal, for instance). The epitaxially generated n Si is etched non-porous without illumination, since no p holes (defect electrons) are present. The local illumination produced using mask 770 generates the required charge substrates in the n-doped region, so that the n-doped epitaxial layer is able to be rendered locally porous by etching at these locations 780. If the etching procedure reaches p doped substrate 750 lying underneath, undercut-type etching is performed across the entire surface. Such undercut-type etching makes it possible to render substrate 750 porous by etching in region 765, since no illumination is required in the p doped region. In addition to a shadow mask 770, diffraction patterns and/or holographic lattices as shown in FIGS. 7b and 7c, may be used as well to produce local illumination on the surface of epitaxial layer 755.

Figure 9A:
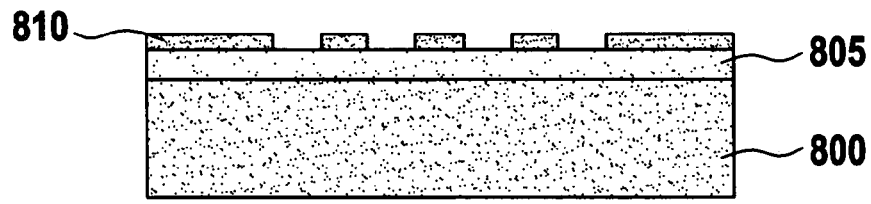
FIGS. 9a-9b show the steps of another example embodiment of a method for producing crosspieces or lattices.
Figure 9B:
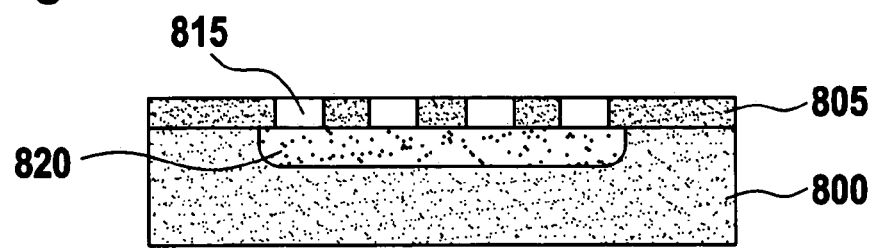

Another example for producing a lattice on porous silicon is the use of a patterned, n doped Si epitaxial layer. To generate this patterned n doped Si epitaxial layer 805, an n doped Si epitaxial layer 805 is deposited on a p doped Si substrate 800, as shown in FIG. 9a, and the former is still unpatterned at this stage. Subsequently, an oxide mask 810 is deposited, which may be patterned by HF, for instance. In a further process step, n doped Si epitaxial layer 805 may then be patterned by means of trenches 815 via the trench mask generated in oxide 805. Since the trench process does not stop on p Si substrate 800, trenches 815 must be produced in a time-controlled manner. However, slight over-etching into substrate 800 is not critical. The structure obtained of oxide 810, n doped epitaxy 805 and p doped substrate 800 in this manner is then rendered porous by etching by anodization in HF, as shown in FIG. 9*b*. Oxide 810 and n doped epitaxial layer 805 are not attacked in this context, whereas p doped Si substrate 800 is rendered porous by etching. Prior to the subsequent epitaxial deposition of the diaphragm, oxide 810 is removed so that the diaphragm is able to grow on the n doped lattice crosspieces.

Figure 10A:
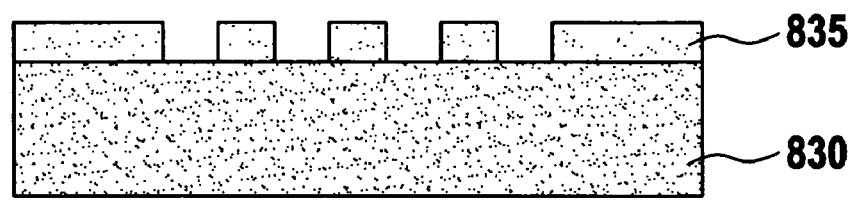
FIGS. 10a-10c show the steps of another example embodiment of a method for producing crosspieces or lattices.
Figure 10B:
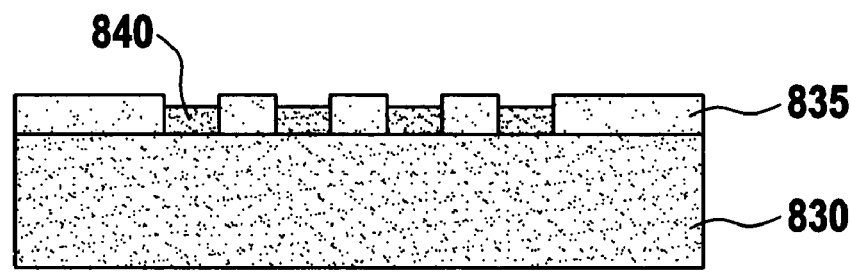
Figure 10C:
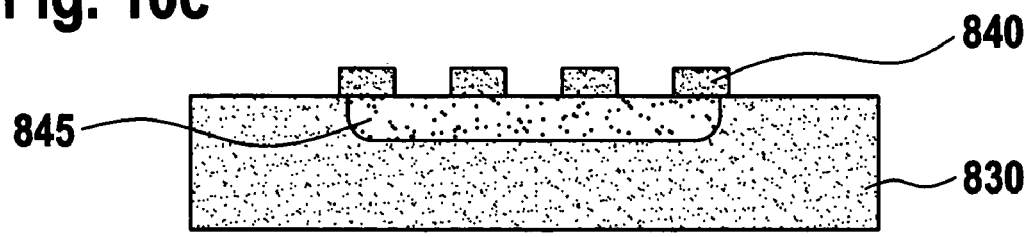

In a further exemplary embodiment, as shown in FIGS. 10*a* through 10*c*, a lattice may be produced on porous silicon 845 in that an n doped Si epitaxial layer 840 is selectively grown on a patterned $SiO_2$ or $Si_3N_4$ mask 835. In this context, $SiO_2$ or $Si_3N_4$ mask 835 acts in a passivating manner in such a way that monocrystalline silicon 840 is able to grow only on exposed Si substrate 830, that is, between oxide regions or nitride regions 835, as shown in FIG. 10*b*. As already described previously and shown in FIG. 10*c*, it is subsequently possible, after the removal of oxide/nitride regions 835, to generate a porous region 845 in substrate 830, which may be reshaped into a cavity in a following annealing process.

An additional exemplary embodiment uses different porosities in the lattice region and in the cavity region. Such an adaptation of the porosities in the mentioned regions allows the optimization of the rearrangement of the porous silicon into a cavity or the growth of the epitaxial silicon diaphragm. For instance, it may be provided that a higher or lower porosity be generated in the cavity region than in the region of the holes. In addition to a sharp separation of the different porosity regions, a porosity gradient is also conceivable.

However, in the starting phase of the epitaxy for forming the diaphragm, attention must be paid that the cavity layer forms a sufficiently stable base, so that an excessively high porosity in the cavity layer would be disadvantageous. Furthermore, it would be desirable to produce high porosity in the holes in the lattice region as well, since this speeds up the formation of the holes at the beginning of the epitaxy growth. By appropriate selection of a (high) porosity in the lattice area, it may thus be prevented that the growth begins on the rearranged silicon in the lattice holes. For, if at least a portion of the epitaxial growth were to begin on the silicon between the lattice crosspieces during the rearrangement, this might cause crystal faults to be created, which would propogate in the diaphragm layer, for example as stack faults.

Figure 11A:
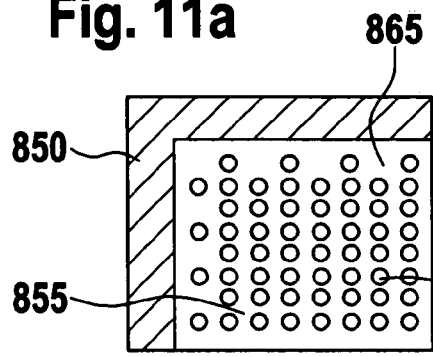
FIGS. 11a-11b and 12a-12c show example embodiments of various lattice and hole geometries according to the present invention.
Figure 11B:
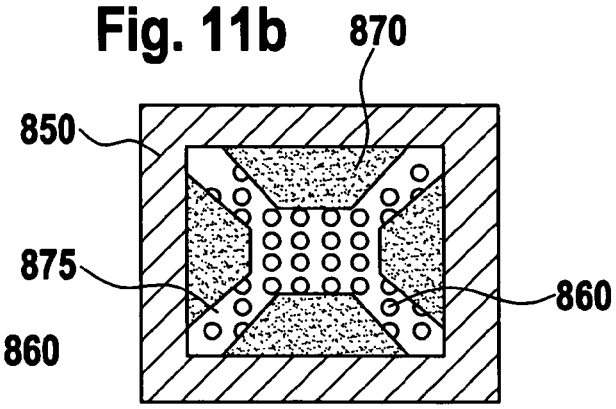

To optimize the mechanical properties of the epitaxial Si diaphragm, the lattice geometries and the hole geometries or the situation of the holes may be varied locally, as is shown in FIGS. 11*a* and 11*b* by way of example. Such a local variation may achieve an improved edge fixing of diaphragm 855 on substrate 850. It is conceivable in this case that lattice holes 860 could be omitted in a regular pattern, for instance at the diaphragm's edge, as is illustrated in FIG. 11*a*. In this example, every other lattice hole at the outermost edge of the hole geometry is omitted, so that no lattice hole 860 is to be found at location 865, for instance. In addition, however, it may also be provided that the outermost row of holes has a smaller diameter compared to the more inwardly lying holes. Another alternative is to broaden the lattice crosspieces at the edge of the diaphragm. In addition, however, the (hole) lattice may also be arranged across only a portion of the diaphragm region, so that a self-supporting diaphragm is created as shown in FIG. 11*b*. In this context, substrate 850 encloses the etching region, which in turn is covered by regions 875 having lattice holes 860 and regions 870 not having lattice holes 860. The diaphragm may then be epitaxially deposited on regions 870 and 875 patterned in this manner.

The mechanical properties of the diaphragm, such as the resonant frequency and/or the rigidity, may also be varied by correspondingly adapted geometries of the lattice crosspieces and holes. One possibility for increasing the rigidity is to omit holes in the center of the diaphragm. However, reliable undercut-type etching of the holes must be ensured. This requirement results in a limit for the maximum number of holes that may be omitted.

If electrically active elements are applied on the diaphragm, it may also be useful to adapt the lattice geometry and hole geometry locally. For instance, piezoresistive resistors, such as for a pressure sensor, may be situated in a region that stands out as a result of an especially defect-free epitaxy (avoidance of leakage currents and shunts via so-called diffusion pipes). This may be accomplished in that, an especially low number of lattice holes, to be overgrown epitaxially, is present in these regions and/or that an especially adapted lattice geometry and hole geometry is used, which is overgrown in a particular satisfactory manner.

Figure 12A:
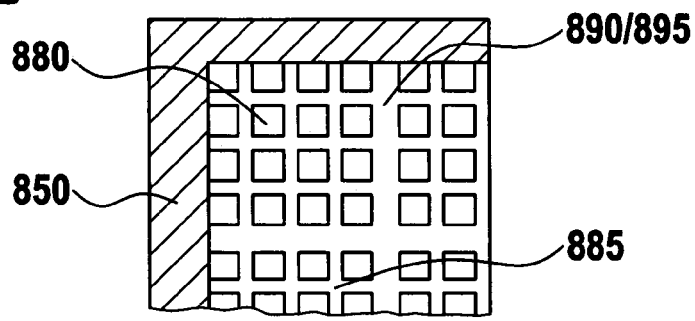

Of course, it may also be provided to superpose a plurality of different lattice geometries and lattice profiles and to combine them in this manner. For instance, FIG. 12*a* shows the simultaneous use of two different rectangular geometries. A second monocrystalline lattice 890 or 895 having broader or thicker crosspieces is superposed on top of first monocrystalline lattice 885 having narrow crosspieces and including porous regions 880. Such a combination may make possible both an additional local diaphragm reinforcement and a reinforced bordering of the diaphragm in substrate 850.

Figure 12B:
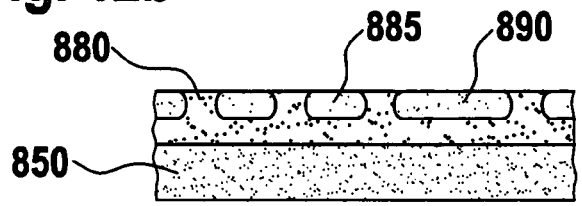
Figure 12C:
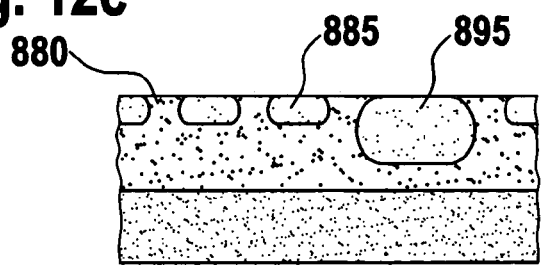

A schematic cross section through a diaphragm region having different lattice geometries is shown in FIG. 12*b*. It can be seen clearly that crosspieces 885 and 890 have different lateral extensions. The superpositioning of various geometries in the form of a lattice may also be achieved by different implantations. In this context, variations of the crosspiece profiles of the lattice are likewise possible as is illustrated by the cross section shown in FIG. 12*c*. In this example two different crosspieces 885 and 895 were produced by different implantation energies and thus different penetration depth.

In addition to the arrangement of the holes in the diaphragm region, it is also possible, as already mentioned, to adapt the cross-section profiles of the lattice to the requirements of the diaphragms to be produced. In the least complicated case, as shown in FIGS. 13*a* and 13*b*, implantation areas 905 (e.g., n doped regions in a p doped substrate) are introduced in substrate 900 to form a lattice 920. Masks 910 of photoresist or Si oxide, which are irradiated by means of an implantation method 915, are used for the selective patterning of implantation regions 905. In this implantation process, the energy or the particles used in implantation method 915 may be adapted to the substrate. After removal of mask 910, substrate 900 may be rendered porous around implantation areas 905, so that crosspieces 920 are created in porous region 925.

Suitable selection of the structure of mask 910 (such as a grey-tone mask of photoresist or Si oxide) in conjunction with an appropriate implantation method 915 allows the lattice profile to be influenced in a variety of ways as is shown in FIGS. 13*c* and 13*d*. The triangular cross-section form of implantation regions 905 illustrated in these figures has advantages with respect to the rearrangement of porous silicon and the subsequent epitaxy. Here, the holes seal faster as a result of the smaller hole diameter on the substrate surface.

Moreover, the region that must be overgrown by the epitaxy is smaller. This leads to fewer crystal faults in the epitaxial layer forming the diaphragm.

In addition to a simple implantation, a multiple implantation using different masks and/or implantation energies is conceivable as well. A possible result of a duplicate implantation having an increase in the implantation energy in the second implantation step (FIG. 13f) is shown in FIGS. 13e to 13g. In FIG. 13g, a similar lattice profile results as that which was already shown in a masking of the substrate according to FIG. 13c.

In general, multiple implantations using appropriate masks and varying implantation energies are able to generate virtually any lattice cross-section profiles.

Figure 14A:
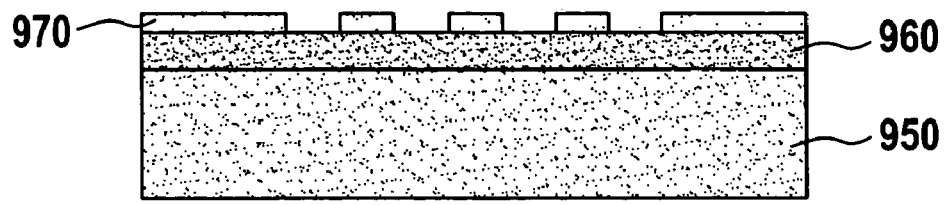
FIGS. 14a-14c show the steps of an example embodiment of a method for producing a lattice.
Figure 14B:
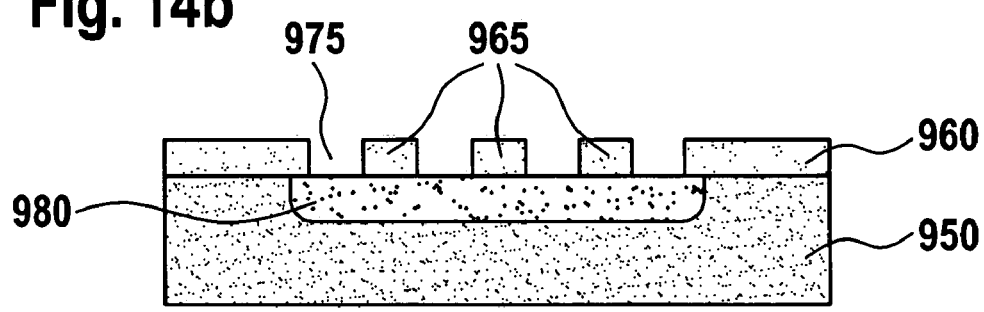
Figure 14C:
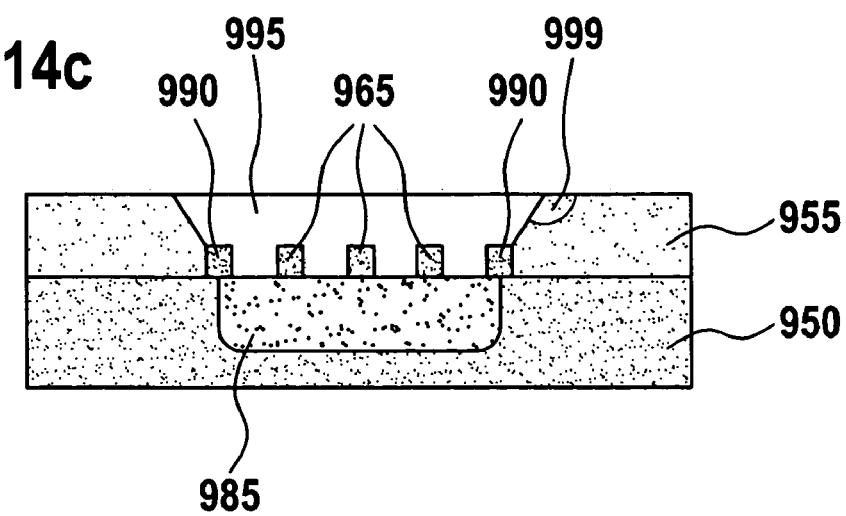

FIGS. 14a and 14b illustrate another possibility for producing a lattice on or within a region rendered porous by etching. In the process (shown in FIG. 14a), an SiC layer 960 is deposited via CVD (silane & propane) on a p doped Si substrate 950 and patterned using an oxide mask 970, for instance, in a wet method (in KOH, KClO$_3$ or the like) or a dry method (for instance SF$_6$). As shown in FIG. 14b, via holes 975 between lattice 965 created by the patterning of SiC layer 960, the p doped silicon may be etched porous by selective anodizing with respect to the SiC in region 980. The reason for this selective etching is that SiC having 2.4 eV (indirect) or 5.3 eV (direct) has a markedly greater band gap than Si. After lattice 965 has been produced, SiC layer 960 may be removed from the surface of the semiconductor substrate down to lattice 965, and a frame 990 which surrounds lattice 965. Silicon may then be epitaxially deposited on semiconductor substrate 950 or on lattice 965 to form a diaphragm. In the process, a monocrystalline Si layer 955 is grown on the edge of semiconductor substrate 950 and a polycrystalline Si layer 995 is grown on SiC 965 and 990, as shown in FIG. 14c. The transition between monocrystalline region 955 and polycrystalline region 995 is determined by the epitaxy parameters. Angle 999 is determinatively a function of these parameters. The porous region may be transformed into a cavity region via an annealing step prior to or following the epitaxy operation.

Figure 15A:
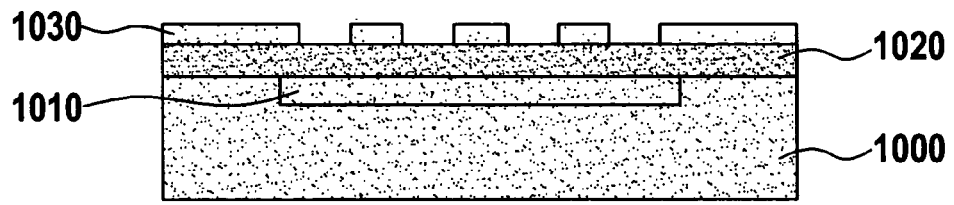
FIGS. 15a-15d show the steps of an example embodiment of a method for producing a lattice and/or a diaphragm.
Figure 15B:
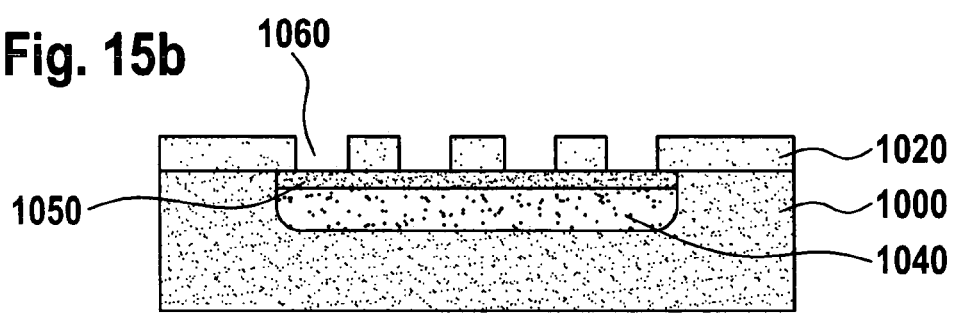

In a further exemplary embodiment, the lattice and diaphragm production may be accomplished via an additional p$^+$ doping. This additional p$^+$ doping is able to broaden and improve on the method described in published German patent document DE 101 38,759, for instance. As illustrated in FIG. 15a, a layer 1010 having an additional p$^+$ doping is produced on a p doped semiconductor substrate 1000, such as an Si substrate, before semiconductor substrate 1000 and layer 1010 are covered by an n doped epitaxial layer 1020. Subsequently, n doped epitaxial layer 1020 may be patterned, using an oxide mask 1030, for instance via a trench process. Within the framework of the patterning it is provided that holes or trenches 1060 are created in epitaxial layer 1020 via which an anodization process may be implemented to produce a (nano-)porous, p doped layer 1040 in semiconductor substrate 1000. Since p$^+$ doped layer 1010 is less susceptible with respect to this anodizing process, a layer 1050 which has meso-pores and is located above the layer having nano-pores is produced in this region, and has lower porosity than layer 1040. In a subsequent annealing process, the material in nano-porous layer 1040 rearranges itself to form a cavity, whereas the material in the meso-porous layer 1050 rearranges to form a sealed layer. The formation of the sealed layer facilitates both the sealing and the overgrowing of lattice holes 1060 during the following epitaxy and also the mechanical stability of the lattice during annealing prior to the epitaxy.

Figure 15C:
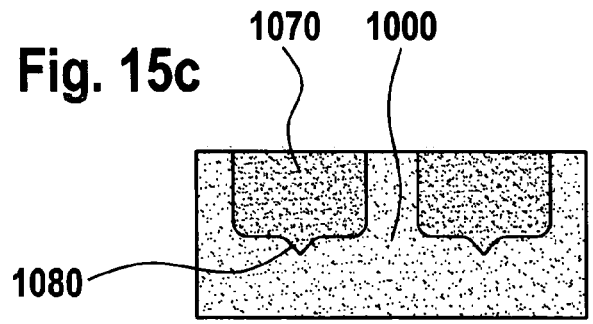
Figure 15D:
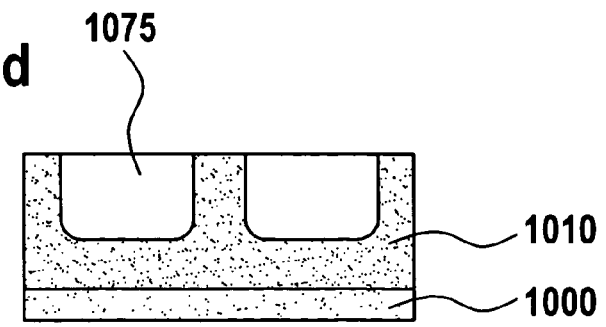

A further advantage of using an additional p$^+$ doping results from a better adaptation of the anodization during production of the lattice. Without the p$^+$ doping, the p doped substrate is etched beneath lattice 1070 in an undercut manner in the form of a beak 1080, as illustrated in FIG. 15c. This beak may be reduced or prevented by additional p$^+$ doping 1010, so that a considerably rounder shape is formed at the underside of lattice crosspieces 1070, as illustrated in FIG. 15d.

It has been shown to be especially advantageous if, besides semiconductor substrate 1000 of p doped silicon, p$^+$ doped layer 1010 and n doped layer 1020 are also made of silicon. However, the use of other semiconductor materials is conceivable as well.

Figure 16A:
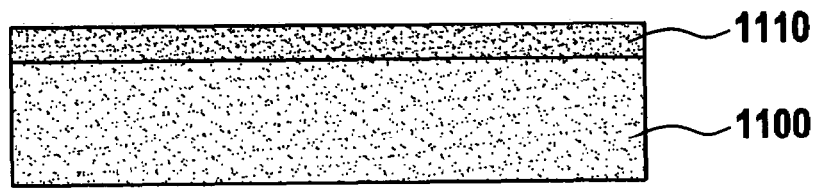
FIGS. 16a-16c show the steps of an example embodiment of a method for producing a lattice and/or a diaphragm.

Another exemplary embodiment for producing a lattice and/or a diaphragm on a semiconductor substrate relates to the production of p$^+$ doped regions in an n doped layer. In this context, a planar n doped (monocrystalline) layer 1110 is first deposited on a p doped substrate 1100, as shown in FIG. 16a. It is possible here that n doped layer 1110 is introduced in p substrate 1100 by means of implantation or by coating or thin epitaxy. Subsequently, p$^+$ doped regions 1120 are introduced in n doped layer 1100. This introduction is advantageously implemented by an implantation process in which the p$^+$ doping must be sufficiently strong to locally redope n doped layer 1110. However, besides an implantation process, other methods that produce p$^+$ doped regions 1120 within n doped layer 1110, may be utilized as well.

Figure 16B:
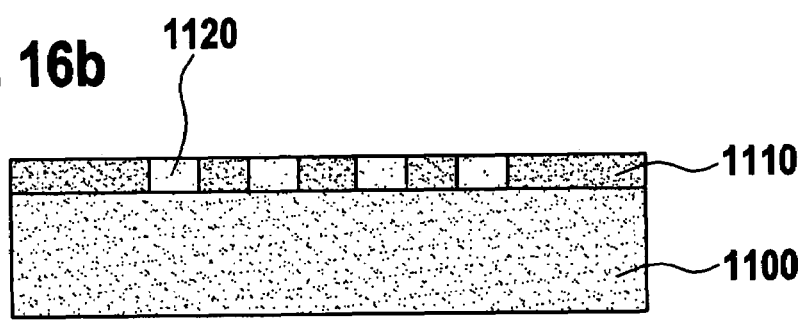
Figure 16C:
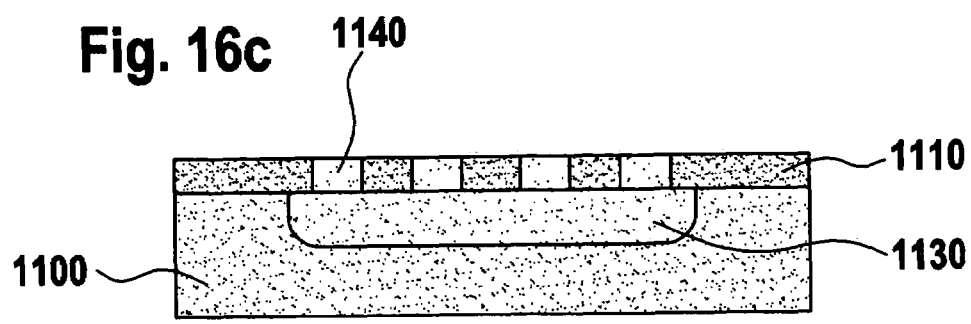

The structure thus produced and illustrated in FIG. 16b may subsequently be anodized, n doped layer 1110 not being attacked and remaining on substrate 1100 in monocrystalline form. In contrast, local p$^+$ doping 1140 is etched to be rendered porous. If anodizing is implemented for a sufficiently long period of time, not only p$^+$ doped regions 1140 but also region 1130 are etched porous as shown in FIG. 16c, region 1130 being located in p substrate 1100 underneath p$^+$ doped region 1140. Therefore, by way of the n doped regions above region 1130, etched to be rendered porous, lattice crosspieces of n doped material are obtained, between which p$^+$ doped material is located, which is etched to be rendered porous.

Figure 17A:
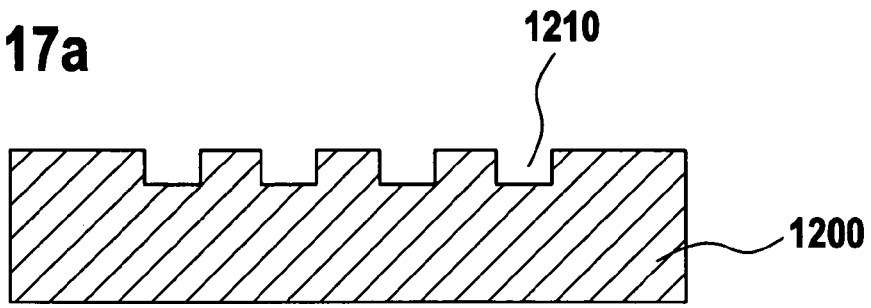
FIGS. 17a-17d show the steps of an example embodiment of a method for producing a lattice and/or a diaphragm.
Figure 17B:
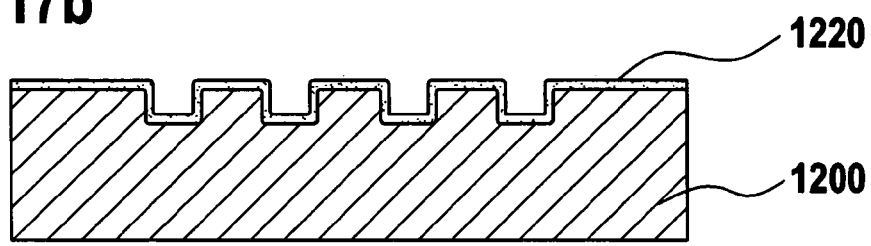
Figure 17C:
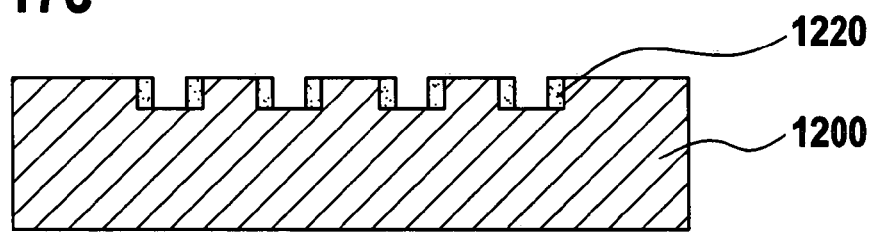

In a further exemplary embodiment (shown in FIGS. 17a through 17d) for producing a monocrystalline lattice on porous semiconductor material, a p doped substrate 1200 may first be patterned by means of a first patterning. This first patterning essentially defines the later diaphragm region. The first patterning is advantageously selected such that it has half of the period of the later lattice constant, i.e., the clearance of holes 1210 with respect to each other. An n doped epitaxial layer 1220 is deposited on p doped substrate 1200 patterned in this fashion. Naturally, it may also be provided that n doped layer 1220 is generated by n doping, e.g. by coating or diffusion, directly in substrate 1200. A portion of n doped layer 1220 is subsequently removed by a physical etching step, so that a reduction in the lattice constant is achieved, as illustrated in FIG. 17c by way of example. If the thickness of layer 1220 has been selected appropriately, the lattice constant is able to be halved as a result.

Figure 17D:
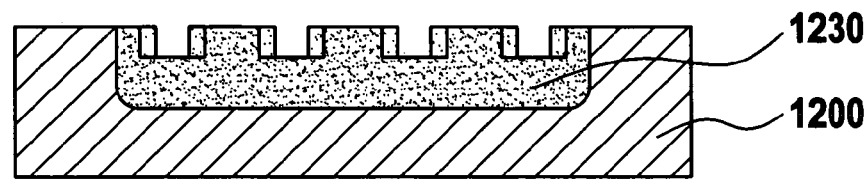

Due to the lowering of the lattice constant, a considerably finer structure of the lattice crosspieces or holes 1210 is obtained on the surface of substrate 1200, so that it is easier for holes 1210 to become overgrown. An anodizing process follows, which once again does not attack the n doping, but renders the p doping of the substrate porous by etching, ultimately forming a region 1230, which etches the n doped lattice crosspieces in an undercut manner (FIG. 17d). As has been mentioned several times, annealing and/or an epitaxy are/is carried out as final step in the production of the diaphragm. The annealing rearranges the porous semiconductor material in region 1230 and seals the holes between the lattice crosspieces. The actual diaphragm, on the other hand, is formed by the epitaxy.

Figure 5A:
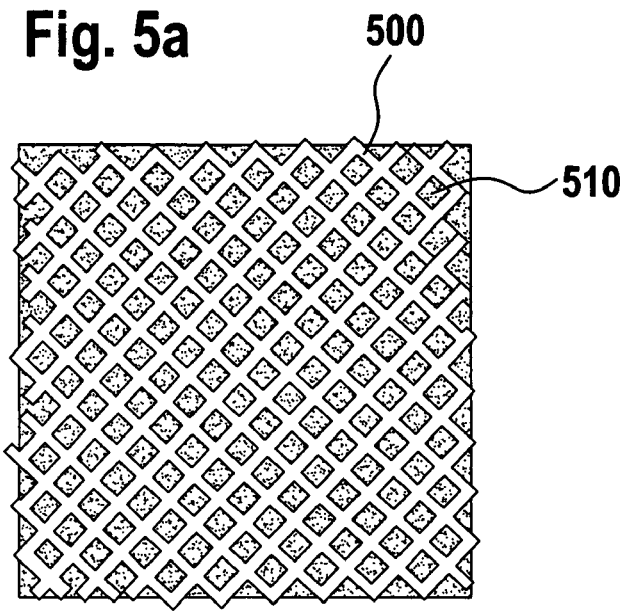
FIGS. 5a-5f illustrate various example embodiments of the crosspieces on which the diaphragm is deposited according to the present invention.
Figure 5B:
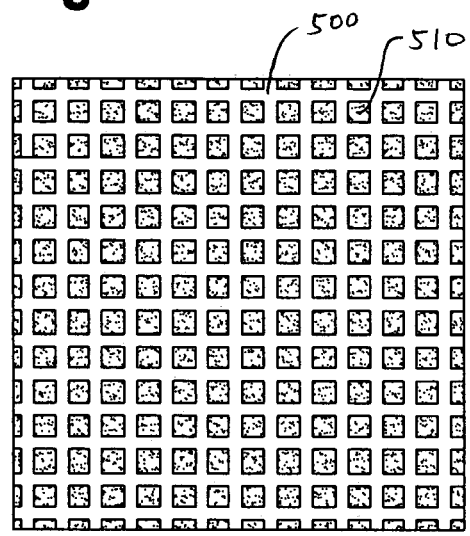
Figure 5C:
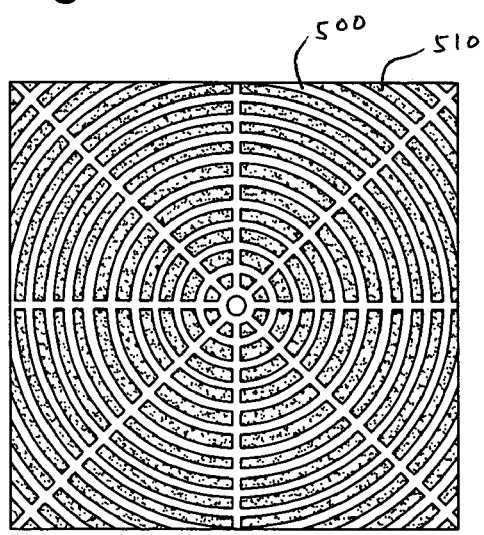
Figure 5D:
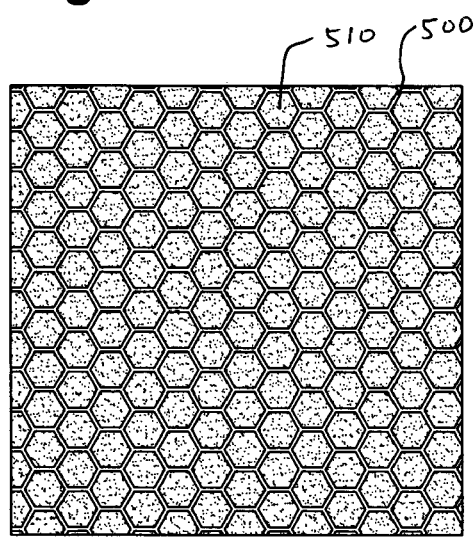
Figure 5E:
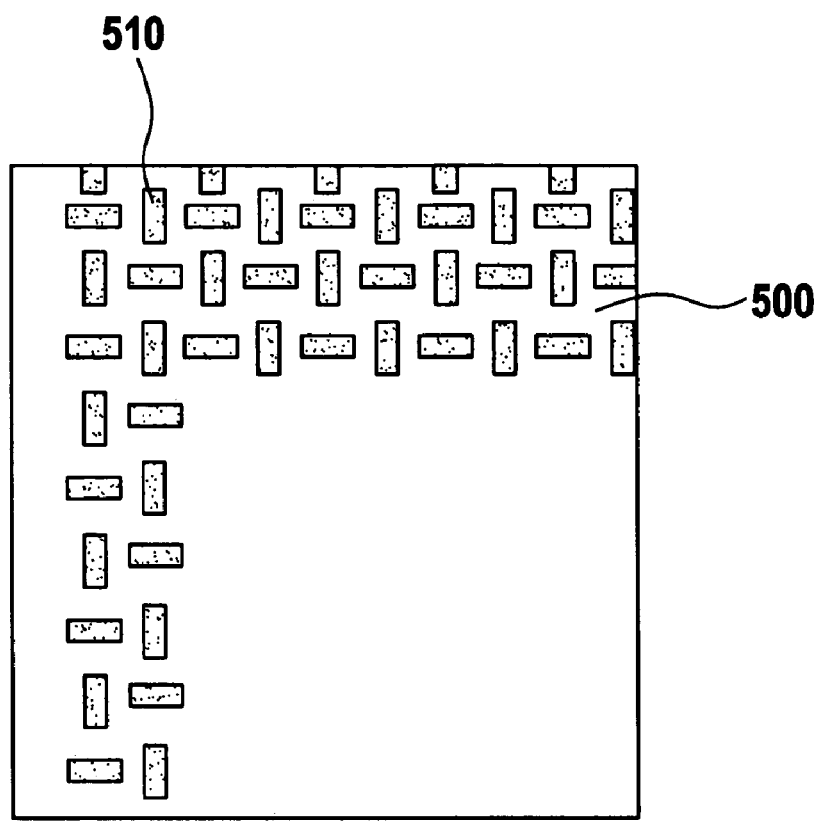
Figure 5F:
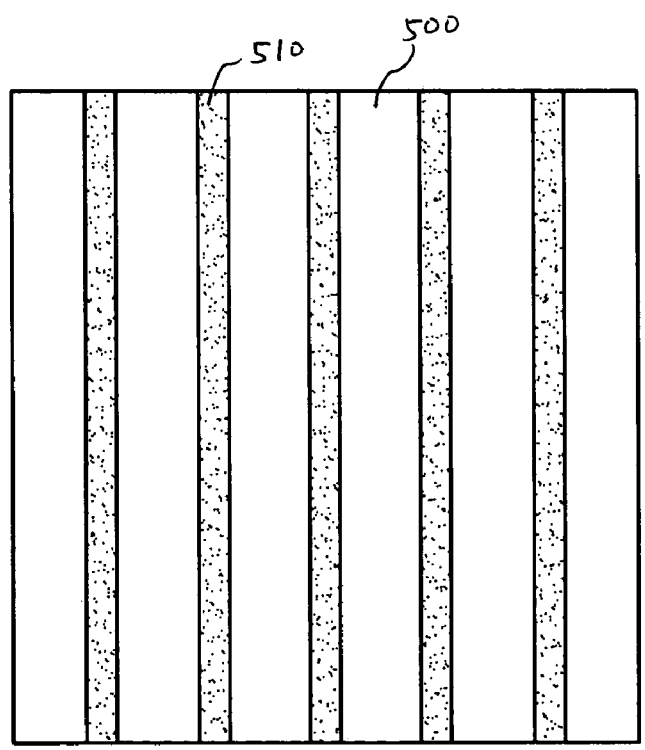

Due to the manner in which the n doped lattice is produced in this exemplary embodiment, only geometries that form cohesive lattice crosspieces after physical etching may be used, for instance, a chessboard-like geometry (see, e.g., FIG. 5e) or a rod-shaped lattice (see, e.g., FIG. 5f).

Silicon is used as semiconductor material for the above-described manufacturing method for producing a lattice above a porous layer. It should be noted, however, that materials or semiconductor materials other than silicon, which are able to be rendered porous by etching via an electrochemical method, for instance, may also be used in the manufacturing method.

What is claimed is:

1. A method for producing a semiconductor component configured as a micromechanical diaphragm sensor, the semiconductor component including a semiconductor substrate having a first region with a first doping, a diaphragm, and a cavity that is located at least partially below the diaphragm, the method comprising:

providing a second region having a second doping above at least one part of the first region, the second region being provided one of in and on the surface of the semiconductor substrate, wherein at least one part of the second region is configured as crosspieces, and wherein at least one part of the second region is provided as a framing for the first region;

at least partially dissolving out the semiconductor material in at least one part of the first region;

depositing a sealing layer above the second region, wherein the sealing layer seals the surface above the first region, starting out from at least one part of the crosspieces of the second region, in at least one of lateral direction and vertical direction; and providing the cavity from at least one part of the first region;

wherein the diaphragm is formed by the deposited sealing layer, and wherein the diaphragm includes at least a part of the crosspieces, and wherein the framing is a vertical extension of the first region into a depth of the semiconductor substrate starting from the surface of the semiconductor substrate.

2. The method as recited in claim 1, wherein at least one of: a) the crosspieces are generated one of above the first region and in the first region; and b) the crosspieces are at least partially adjacent to the first region.

3. The method as recited in claim 1, wherein the framing and the crosspieces differ in at least one of relative degrees of doping and relative doping concentrations.

4. The method as recited in claim 3, wherein at least one of:
a) at least one of: i) the first and the second regions have different dopings, ii) the sealing layer is deposited using an epitaxial method, and iii) the crosspieces and the framing have different doping concentrations;
b) at least one of: i) the semiconductor substrate has silicon, ii) after the step of at least partially dissolving out the semiconductor material in at least one part of the first region, the first region has a uniformly high porosity, and iii) between the first and the second region, a non-conductive boundary layer is generated;
c) at least one of: i) the semiconductor material of the first region is at least partially rendered porous below the crosspieces, ii) the crosspieces are situated in a lattice above one of the first region and the cavity, wherein holes between the lattice crosspieces have a diameter that is less than 3 μm, iii) after a thermal oxidation and before the epitaxy, the oxidized porous semiconductor material is dissolved out, and iv) before the deposit of the sealing layer, the porous semiconductor material is selectively removed by one of an additional wet-chemical etching using one of TMAH and KOH, and an additional dry-chemical etching using one of $ClF_3$ and $XeF_2$.

5. The method as recited in claim 1, wherein the vertical extension of the first region and the vertical extension of the crosspieces differ, starting from the surface of the semiconductor substrate, and wherein at least one of: a) the first region has a greater vertical extension than the crosspieces; b) the crosspieces have a lesser vertical extension than the framing; and c) the crosspieces vary in at least one of vertical and lateral extensions.

6. The method as recited in claim 1, wherein the dissolving out of the semiconductor material in the first region is achieved by a micromechanical process, wherein the micromechanical process is such that, in response to a suitable selection of parameters controlling the micromechanical process, at least one of: a) the semiconductor material is rendered porous in at least one part of the first region, a porosity of up to 100% being provided; and b) the cavity formation is achieved in the first region by one of an anodizing process and electropolishing.

7. The method as recited in claim 6, wherein, before the depositing of the sealing layer, one of the porous semiconductor material and the cavity walls are oxidized.

8. The method as recited in claim 7, wherein the cavity is formed by one of: a) an annealing step after the depositing of the sealing layer, by rearrangement of the porous semiconductor material; and b) an at least partially selective dissolving out of the porous semiconductor material, wherein the selective dissolving out of the porous semiconductor material takes place through at least one access hole.

9. The method as recited in claim 8, wherein the sealing layer is applied on the front side of the semiconductor substrate, and wherein the access hole is generated from one of the back side of the semiconductor substrate and the front side of the semiconductor substrate, and wherein for the case of the access hole generated from the front side, the access hole is sealed after the dissolving out of the semiconductor material, in a pressure-tight manner.

10. The method as recited in claim 1, wherein at least one of a) the porous semiconductor material in the first region and b) the cavity is passivated before the depositing of the sealing layer, and wherein the passivation substantially prevents a depositing of the sealing layer at least one of on the porous layer and onto the cavity walls.

11. The method as recited in claim 1, further comprising: patterning the diaphragm to form a vibratory structure.

12. The method as recited in claim 1, wherein during the step of at least partially dissolving out the semiconductor material in at least one part of the first region, the surface of the semiconductor substrate is irradiated by a radiation source in the region of the crosspieces, whereby the irradiation prevents a dissolving out of the material in irradiated areas, the surface being irradiated at least one of by a laser and with the aid of a patterning mask.

13. The method as recited in claim 1 wherein at least one of: a) the crosspieces are generated one of above the first region and in the first region; and b) the crosspieces are at least partially adjacent to the first region, and wherein the framing and the crosspieces differ in at least one of relative degrees of doping and relative doping concentrations.

14. The method as recited in claim 13, wherein the vertical extension of the first region and the vertical extension of the crosspieces differ, starting from the surface of the semiconductor substrate, and wherein at least one of: a) the first region has a greater vertical extension than the crosspieces; b) the crosspieces have a lesser vertical extension than the framing; and c) the crosspieces vary in at least one of vertical and lateral extensions.

15. The method as recited in claim 13, wherein the dissolving out of the semiconductor material in the first region is achieved by a micromechanical process, wherein the micromechanical process is such that, in response to a suitable selection of parameters controlling the micromechanical process, at least one of: a) the semiconductor material is rendered porous in at least one part of the first region, a porosity of up to 100% being provided; and b) the cavity formation is achieved in the first region by one of an anodizing process and electropolishing.

16. The method as recited in claim 15, wherein, before the depositing of the sealing layer, one of the porous semiconductor material and the cavity walls are oxidized, and wherein the cavity is formed by one of: a) an annealing step after the depositing of the sealing layer, by rearrangement of the porous semiconductor material; and b) an at least partially selective dissolving out of the porous semiconductor material, wherein the selective dissolving out of the porous semiconductor material takes place through at least one access hole.

17. The method as recited in claim 16, wherein the sealing layer is applied on the front side of the semiconductor substrate, and wherein the access hole is generated from one of the back side of the semiconductor substrate and the front side of the semiconductor substrate, and wherein for the case of the access hole generated from the front side, the access hole is sealed after the dissolving out of the semiconductor material, in a pressure-tight manner.

18. The method as recited in claim 13, further comprising: patterning the diaphragm to form a vibratory structure, wherein at least one of a) the porous semiconductor material in the first region and b) the cavity is passivated before the depositing of the sealing layer, and wherein the passivation substantially prevents a depositing of the sealing layer at least one of on the porous layer and onto the cavity walls.

19. The method as recited in claim 18, wherein during the step of at least partially dissolving out the semiconductor material in at least one part of the first region, the surface of the semiconductor substrate is irradiated by a radiation source in the region of the crosspieces, whereby the irradiation prevents a dissolving out of the material in irradiated areas, the surface being irradiated at least one of by a laser and with the aid of a patterning mask.

20. The method as recited in claim 13, wherein at least one of:
a) at least one of: i) the first and the second regions have different dopings, ii) the sealing layer is deposited using an epitaxial method, and iii) the crosspieces and the framing have different doping concentrations;
b) at least one of: i) the semiconductor substrate has silicon, ii) after the step of at least partially dissolving out the semiconductor material in at least one part of the first region, the first region has a uniformly high porosity, and iii) between the first and the second region, a non-conductive boundary layer is generated;
c) at least one of: i) the semiconductor material of the first region is at least partially rendered porous below the crosspieces, ii) the crosspieces are situated in a lattice above one of the first region and the cavity, wherein holes between the lattice crosspieces have a diameter that is less than 3 μm, iii) after a thermal oxidation and before the epitaxy, the oxidized porous semiconductor material is dissolved out, and iv) before the deposit of the sealing layer, the porous semiconductor material is selectively removed by one of an additional wet-chemical etching using one of TMAH and KOH, and an additional dry-chemical etching using one of $ClF_3$ and $XeF_2$.

* * * * *

UNITED STATES PATENT AND TRADEMARK OFFICE
CERTIFICATE OF CORRECTION

PATENT NO. : 7,569,412 B2
APPLICATION NO. : 11/011898
DATED : August 4, 2009
INVENTOR(S) : Benzel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 331 days.

Signed and Sealed this

Seventh Day of September, 2010

David J. Kappos
*Director of the United States Patent and Trademark Office*